United States Patent
Gaikwad

(10) Patent No.: US 10,877,839 B2
(45) Date of Patent: *Dec. 29, 2020

(54) RECOVERY OF A COHERENT SYSTEM IN THE PRESENCE OF AN UNCORRECTABLE ERROR

(71) Applicant: Arteris, Inc., Campbell, CA (US)

(72) Inventor: Parimal Gaikwad, Mountain View, CA (US)

(73) Assignee: ARTERIS, INC., Campbell, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 15/857,580

(22) Filed: Dec. 28, 2017

(65) Prior Publication Data

US 2019/0095279 A1 Mar. 28, 2019

Related U.S. Application Data

(63) Continuation-in-part of application No. 15/712,894, filed on Sep. 22, 2017.

(51) Int. Cl.

| | |
|---|---|
| *G06F 11/10* | (2006.01) |
| *H03M 13/29* | (2006.01) |
| *G11C 29/52* | (2006.01) |
| *H03M 13/35* | (2006.01) |
| *G11C 29/00* | (2006.01) |

(Continued)

(52) U.S. Cl.
CPC ...... *G06F 11/1068* (2013.01); *G06F 11/1064* (2013.01); *G11C 29/52* (2013.01); *G11C 29/76* (2013.01); *H03M 13/29* (2013.01); *H03M 13/2906* (2013.01); *H03M 13/353* (2013.01); *H03M 13/356* (2013.01); *G11C 29/44* (2013.01); *G11C 2029/0411* (2013.01)

(58) Field of Classification Search
CPC ......... G11C 29/44; G11C 29/76; G11C 29/52; G11C 2029/0411; G06F 11/1048; G06F 11/1068; H03M 13/2906; H03M 13/356; H03M 13/29; H03M 13/353
See application file for complete search history.

(56) References Cited

U.S. PATENT DOCUMENTS

| | | | | |
|---|---|---|---|---|
| 4,562,536 A | * | 12/1985 | Keeley | ............... G06F 11/1666 |
| | | | | 711/E12.018 |
| 4,833,601 A | * | 5/1989 | Barlow | ............... G06F 11/0724 |
| | | | | 711/121 |

(Continued)

*Primary Examiner* — Guy J Lamarre
(74) *Attorney, Agent, or Firm* — Dana Legal Services; Jubin Dana

(57) ABSTRACT

A system, and corresponding method, is described for correcting an uncorrectable error in a coherent system. The uncorrectable error is detecting using an error detecting code, such as parity or SECDED. The cache controller or agent calculates a set of possible addresses. The directory is queried to determine which one of the set of possible addresses is the correct address. The agent and/or cache controller is updated with the correct address or way. The invention can be implemented in any chip, system, method, or HDL code that perform protection schemes and require ECC calculation, of any kind. Embodiments of the invention enable IPs that use different protections schemes to reduce power consumption and reduce bandwidth access to more efficiently correct errors and avoid a system restart when an uncorrectable error occurs.

6 Claims, 13 Drawing Sheets

(51) Int. Cl.
*G11C 29/44* (2006.01)
*G11C 29/04* (2006.01)

(56) References Cited

U.S. PATENT DOCUMENTS

| | | | |
|---|---|---|---|
| 10,146,615 B2* | 12/2018 | Gaikwad | G06F 12/0895 |
| 2003/0196048 A1* | 10/2003 | McAllister | G06F 12/0826 |
| | | | 711/147 |
| 2004/0025095 A1* | 2/2004 | Nemani | G11C 29/808 |
| | | | 714/710 |
| 2014/0201468 A1* | 7/2014 | Blaner | G06F 12/0831 |
| | | | 711/146 |
| 2016/0034353 A1* | 2/2016 | Tuers | H03M 13/1111 |
| | | | 714/764 |

\* cited by examiner

| data bits | Bits needed for SEC ECC | bits needed for SECDED ECC |
|---|---|---|
| 1 | 2 | 3 |
| 2-4 | 3 | 4 |
| 5-11 | 4 | 5 |
| 12-26 | 5 | 6 |
| 27-57 | 6 | 7 |
| 58-120 | 7 | 8 |
| 121-247 | 8 | 9 |
| 248-502 | 9 | 10 |

FIG. 1A

| WAY0, ECC0 | WAY1, ECC1 | WAY2, ECC2 | . . . | WAY$n$-1, ECC$n$-1 |
|---|---|---|---|---|

FIG. 1B

```
module encoder(
    input data_in[31:0],
    input parity_in[3:0],
    output data_out[31:0],
    output ecc_out[6:0]
);

endmodule
```

RECOVERY OF A COHERENT SYSTEM IN THE PRESENCE OF AN UNCORRECTABLE ERROR

CROSS REFERENCE TO RELATED APPLICATION

This application is a continuation-in-part of U.S. Non-Provisional Utility application Ser. No. 15/712,894 filed on Sep. 22, 2017 and titled SYSTEM AND METHOD FOR REDUCING ECC OVERHEAD AND MEMORY ACCESS BANDWIDTH by Parimal GAIKWAD, the entire disclosure of which is incorporated herein by reference.

FIELD OF THE INVENTION

The invention is in the field of autonomous systems using a coherent network-on-chip and, more specifically, related to correcting an uncorrectable error in a coherent system.

BACKGROUND

Electrical or magnetic interference inside a computer system can cause a single bit of Random-Access Memory (RAM) to spontaneously flip to the opposite state. An example of a single-bit error: a single bit is stuck at 1 due to a faulty chip, or becomes changed to 1 and the character "8" (decimal value 56 in the ASCII encoding) is stored in the byte that contains the stuck bit at its lowest bit position. As a result, the "8" (0011 1000 binary) has erroneously become a "9" (0011 1001). This is an error that needs to be detected.

There are various protection schemes used to detect errors in data, such as the type of error noted above. Most error checking for protection schemes involve encoding error checking information with the payload or data for transmission or storage, and later checking that the information is consistent or the same. Numerous protection and error checking schemes are well known, including triplication, parity, error correction codes (ECC), and 8b10b encoding. Protection schemes apply to any of source data, addresses, packet headers, and other useful transferred information, all of which are data in the context of adding redundant information. However, protection schemes demand memory access and require bandwidth.

Caches support ECC protection for reliability and resiliency. ECC overhead is the ratio of bits used for error protection verses overall data protected. In cache structures like system directory, each way is protected by Error Correcting Codes like Single-Error Correcting and Double-Error Detecting (SECDED). Adding ECC for every cache way is preferred as while writing to memory only write operation is performed instead of read-modify-write saving bandwidth and power.

In order to provide some efficiency, some schemes combine the ECC calculation by combining several ways. One example is that for every four ways an ECC is calculated. In one example, if there are 20-bits of data, then you need 6-bits of overhead for the ECC. Accordingly, the entire data string is 26 bits. The ECC overhead is about 23%. The more data strings you can combine, the lower the percentage of ECC bits needed as overhead relative to the data string. For example, in some instances, 200-bits may require 8-bits of ECC overhead. The entire data string is 208 bits and, hence, the ECC overhead is about 4%. However, when data strings are combined, any update to any portion of the data strings requires that the entire ECC be recalculated.

For example, one scheme would be to have a total ECC calculated for a n-ways or x-bits. For example, for WAY0, WAY1, WAY2, and WAY3 an ECC calculation for these ways results in an $ECC_{TOTAL}$ for a data string with these four ways. However, when one way, such as WAY0, is updated or changed, then the entire data string needs to be accessed to calculated the new $ECC_{TOTAL}$ because WAY0 was updated. This results in a great deal of inefficiency and demand on data access and bandwidth. As more data bits are combined, the lower the ECC overhead becomes. However, the problem Therefore, what is needed a system and method for updating or calculating a new $ECC_{TOTAL}$ while reducing the ECC overhead and, thus, the demand on the data access bandwidth.

In some instances, when an uncorrectable error occurs, such as in the WAY or address of an agent in a cache coherent system, the system fails and operation ceases until the system is restarted. In the application where autonomous system need to be fully operation, such as in autonomous driving system and related solutions, avoiding system fail operational is becoming essential. Therefore, what is needed is a system and method that would enable recovery of the system in the presence of uncorrectable errors in any one of the tag arrays tracked by the directory with addition of minimal hardware.

SUMMARY OF THE INVENTION

The invention is directed to a system and method that allows recovery in the presence of an uncorrectable error in any one of the tag arrays tracked by the directory with addition of minimal hardware.

Additionally, the invention is directed to a system and method for updating or calculating a new $ECC_{TOTAL}$ that is more efficient and reduces demand on the data access bandwidth. The invention pertains to chips, systems, method, and HDL code that perform protection schemes. Embodiments of the invention enable IPs that use different protections schemes to communicate. An encoder unit accomplishes this by receiving redundant information according to one scheme and encoding either the same or different redundant information according to another scheme. This is useful in interconnects within SoCs. In some embodiments, the interconnect uses a protection scheme that is the same as one of the IPs but in other embodiments the interconnect uses a unique protection scheme.

The invention also encompasses the challenge of data changing within the interconnect, such as due to a change in serialization, due to a decrease in data bus width, or a firewall that modifies a packet header. In either case, in each protection scheme, correctness is checked and information calculated.

The hardware design and the method of operation of SoCs can embody the invention. Furthermore, HDL code can embody the invention and one or more non-transient computer readable media that store such HDL code can embody the invention. HDL code that is a parity conversion placeholder embodies the invention, as it provides another designer the interfaces that enable communication between heterogeneous IPs that use different protection schemes. Some third-party interconnect configuration tools generate such HDL code to enable chip designers to implement application-specific protection scheme conversion.

Some embodiments encapsulate the redundant information receive from a receiving interface within the information sent on the sending interface. Some embodiments convert the form of the same redundant information received on the receiving interface as the information sent on the sending interface. Some embodiments receive redundant information, perform a consistency check, encode different redundant information, and send that.

Some embodiments assert a signal, such as in the form of a pulse, when a checker detects an error. Some embodiments check consistency and count errors detected. Some embodiments that use ECC count errors corrected, and separately count uncorrected errors.

Encoders embody the invention if the convert from any one to any other protection scheme. This includes conversion from or to any of parity, ECC, a different form of parity, a different form of ECC, SEC ECC, and SECDED ECC. Furthermore, some embodiments apply a protection scheme per-byte, some per-word, some per flow control unit (flit), some per packet, and some per burst.

Some embodiments apply protection schemes per multi-byte word, but split the redundant information and transport each portion with a different byte. This is helpful if word size and re-serialization changes are present in the interconnect. Some embodiments encode other sideband information that relates to the data transfer, but is no part of the protection scheme with the received or sent data. Some such sideband information is status, control commands, and credits.

Some encoders according to the invention receive data of one-word size and send data of another word size. Accommodating such data width conversion necessitates protection scheme conversion.

BRIEF DESCRIPTION OF THE DRAWINGS

FIG. 1A is a table of the number of bits of redundant information needed for SEC ECC and for SECDED ECC for ranges of data bits.

FIG. 1B shows a data strings with n-WAYs and n-ECCs.

DETAILED DESCRIPTION

The invention is described in accordance with the aspects and embodiments in the following description with reference to the FIGs., in which like numbers represent the same or similar elements. Reference throughout this specification to "one embodiment," "an embodiment," or similar language means that a particular feature, structure, or characteristic described regarding the embodiment is included in at least one embodiment of the invention. Thus, appearances of the phrases "in one embodiment," "in an embodiment," "in certain embodiments," and similar language throughout this specification may, but do not necessarily, all refer to the same embodiment. It is noted that, as used in this description, the singular forms "a," "an" and "the" include plural referents, unless the context clearly dictates otherwise.

The described features, structures, or characteristics of the invention may be combined in any suitable manner in accordance with the aspects and one or more embodiments of the invention. In the following description, numerous specific details are recited to provide an understanding of various embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring the aspects of the invention.

All publications and patents cited in this specification are herein incorporated by reference as if each individual publication or patent were specifically and individually indicated to be incorporated by reference and are incorporated herein by reference to disclose and describe the methods and/or system in connection with which the publications are cited. The citation of any publication is for its disclosure prior to the filing date and should not be construed as an admission that the invention is not entitled to antedate such publication by virtue of prior invention. Further, the dates of publication provided may be different from the actual publication dates, which may need to be independently confirmed.

As discussed herein, various error detecting codes and error detection algorithms may be used. FIG. 1A shows a table of the number of bits of redundant information needed to provide SEC ECC and SECDED ECC for ranges of numbers of data bits. Referring now to FIG. 1B, a tracking or index table is shown that stores data stored in the way, way information, and current ECC overhead bits. The configuration for organizing shows that each way has its own ECC. This configuration allows for updating or writing a specific way in this structure by recalculate ECC on the specific way and update the ECC by writing that specific way only. Thus, any index table or memory update for the specific way is a write operation, such that updating WAY2, the system only needs to write WAY2.

Figures 1C, 1D:
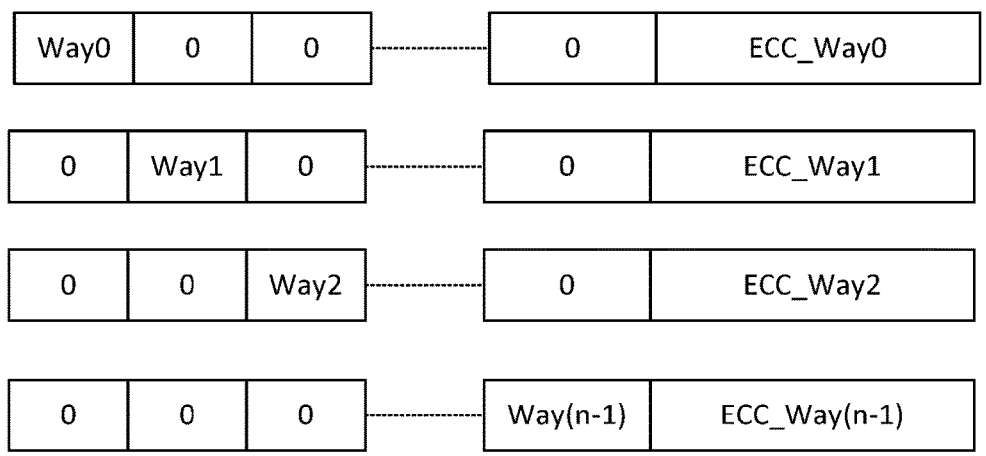
FIG. 1C shows a data strings and one corresponding $ECC_{TOTAL}$ for the data string.
FIG. 1D shows a data string masks with an ECC for WAY0, WAY1, WAY2, and WAY3.

Referring now to FIG. 1C, shows another tracking or index table that organizes the data string. In accordance with some aspects of the invention, all the ways are put together and a common ECC is calculated on all the ways. The advantage of having this is more space efficient. However, doing an update on a specific way in this structure requires a read, modify, write operation in order to recalculate the ECC on all ways and determine the common ECC. This requires more bandwidth while doing an update. Thus, instead of performing just a write operation, there is a read-modify-write operation. For each data, there is a respective ECC. In accordance with various aspects of the invention, an $ECC_{TOTAL}$ is calculated for WAY0 through WAY3. Thus, when any one way is changed or updated, then the ECC for that WAY can be calculated and used to update the $ECC_{TOTAL}$.

In accordance with some aspects of the invention, the common ECC can be determined with a write operation. Calculating the ECC is an operation that is associative and commutative. Referring to FIG. 1D, mask is shown for each WAY in an index or tracking table n-WAYs. The ECC for each way can be calculated and stored in a mask index. Whenever a WAY needs to be updated or goes pending for a given index entry in the transaction or index table, the old WAY information is stored in the index or transaction table and the ECC information is associated with the index entry is also stored to generate a mask. Thus, the overall ECC is decomposed and only one WAY is considered at time by setting or assuming all other ways are 0, which generates the mask for the specific WAY. Thus, the final ECC will be ECC_WAY0 XOR ECC_WAY1 XOR ECC_WAY2 XOR ECC_WAY(n−1), which is the same as the total or collective ECC (WAY0 . . . WAY(n−1)).

In accordance with some aspects of the invention, when WAY2 is pending and needs to be updated with a new WAY, such as WAY2A, then the overall ECC can be calculated using the masks for the respective WAY, as follows:

$$\{ECC_{WAY_n\_OLD\_DATA}\} \text{ XOR } \{ECC_{OLD\_TOTAL}\} \text{ XOR } \{ECC_{WAY_n\_NEW\_DATA}\}$$

$$= $$

$$ECC_{NEW\_TOTAL}$$

using the data strings or masks shown in FIG. 1D:

ECC_WAY0 XOR ECC_WAY1 XOR ECC_WAY2
  XOR . . . ECC_WAY($n$−1) XOR ECC_WAY2
  XOR ECC_WAY2A

In the above equation, two of the terms are the same and due to the XOR property, will cancel out. Thus, the ECC can be calculated and becomes the new Value of the new ECC computation which includes the new data string WAY2A, and is equal to the following equation:

ECC_WAY0 XOR ECC_WAY1 XOR ECC_WAY2A
  XOR . . . ECC_WAY($n$−1)

Thus, instead of doing a read-modify-write for updating an index and the ECC, the system will just update WAY2 data with the new WAY2A data and calculate the new ECC using just a write. In accordance with some embodiments of the present invention, and $ECC_{TOTAL}$ is calculated for A, B, C, and D.

Figure 2A:
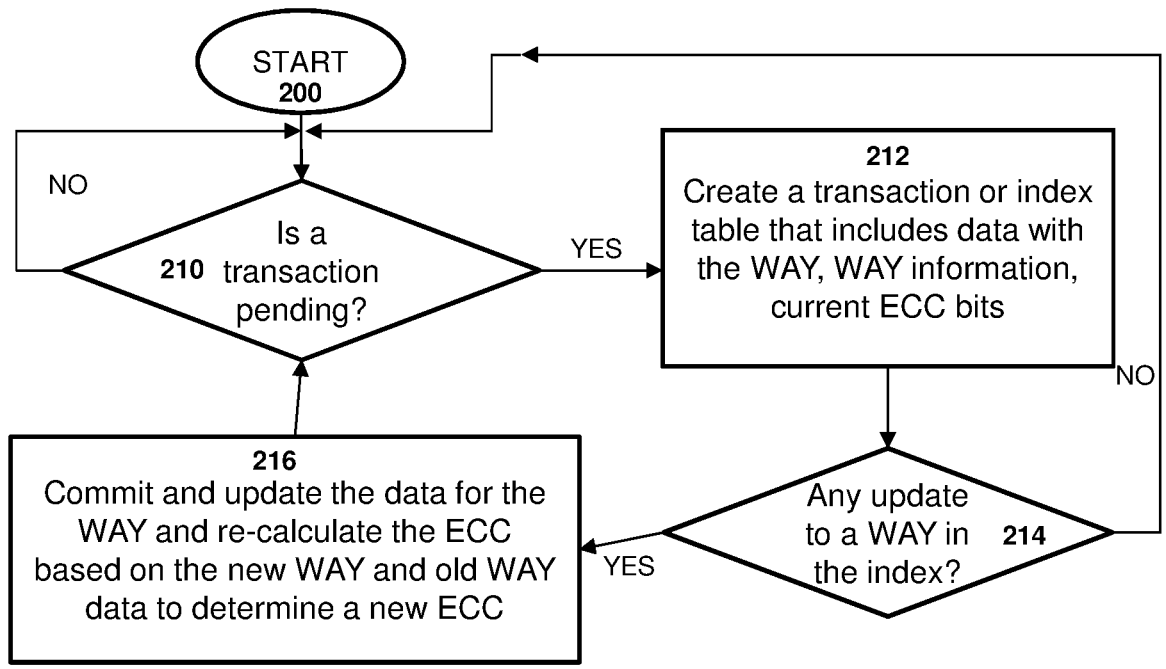
FIG. 2A is a flow chart for the process of determine an ECC using a write operation.

Referring now to FIG. 2A, the process of determining a new ECC when a transaction is pending being at step 200. At step 210 the system determines if there is a transaction pending. If not, the process remains at step 210 and the system continues to monitor for a pending transaction. If there is a transaction pending, then the process continues to step 212. At step 212, the system creates a transaction table or index that includes at least the WAY, the WAY information, and the current ECC, which is also the old ECC. The process then continues to step 214. At step 214 the system determines if the pending transaction resulted in a WAY that is updated or a new WAY in the index or transaction table. If not, then the process returns to step 210. If there is a WAY that is updated or a new WAY, then the process continues to step 216. At step 216, the system writes or commits the new WAY and recalculates the ECC based on the new WAY and the unchanged or remaining or old WAYs. The process determines the new ECC using the following equation, as noted above and reproduced here:

ECC_WAY0 XOR ECC_WAY1 XOR ECC_WAY2A
  XOR . . . ECC_WAY($n$−1)

which is derived from performing the following:

ECC_WAY0 XOR ECC_WAY1 XOR ECC_WAY2
  XOR . . . ECC_WAY($n$−1) XOR ECC_WAY2A
  XOR ECC_WAY2

Many SoCs include IPs that require ECC overhead and the efficiency of performing write only operations to update the ECC significantly reduces ECC overhead and bandwidth required to read from memory. According to the aspects of the invention, it is possible to reduce index or transaction table or directory size from an ECC overhead from 20% of the area and bandwidth needed down to ECC overheads around 5%. This results in 15% reduction in overall coherent system area. Lower RAM (Static or Dynamic) area results in lower power consumption and heat. Also, lower memory area results in lower bandwidth demands and higher efficiency or the SoC and the IPs, the have interfaces for sending and receiving data.

Figure 2B:
FIG. 2B shows a master and a slave IP core, each with different protection schemes.

As shown in FIG. 2B, each interface is either a master type or a slave type, each of which is designed to be coupled to the other. Interfaces include various signals, as prescribed by protocols, and data is normally one of the signals. Other signals, which are involved in controlling the exchange of data between masters and slaves, are omitted from interfaces depicted in the figures of this patent.

Each data signal has an inherent number of bits, also known as the width or the size of the signal. Bits of signals are conventionally indexed starting at zero. Therefore, a 32-bit signal has bits 0 to 31, which are notated, as in FIG. 2B, [31:0]. Data protection is part of some interface protocols. Some protocols encode the redundant information within the data signal, but many protocols transfer redundant information as separate signals. In FIG. 2B, IP A has a 32-bit data bus and a 4-bit parity protection scheme whereas IP B has a 32-bit data bus and a 7-bit ECC protection scheme. Naturally, the interface protocols of IP A and IP B are incompatible and so the master and slave interfaces cannot be directly connected.

Figure 3A:
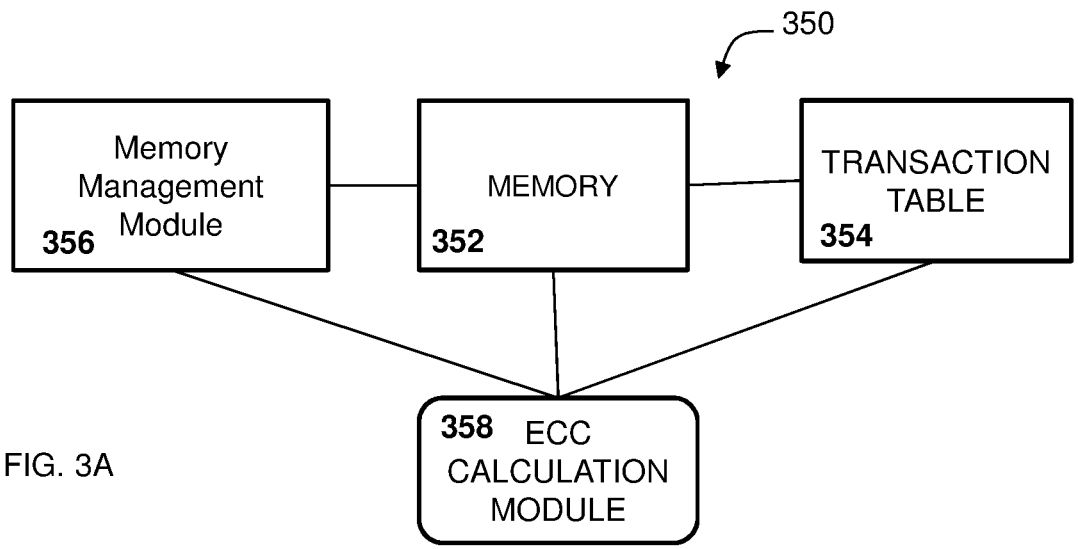
FIG. 3A shows a system in accordance with the various aspects of the invention.

FIG. 3A shows a system 350 that includes a memory 352 communicating with or having a transaction table or an index 354. The memory 352 is in communication with a memory management module 356. The transaction table 354 stores information about the transactions and index information. The system 352 also includes an ECC calculation module 358 that is capable of calculating a new ECC, in accordance with the various aspects of the invention, using a new or updated WAY. The ECC calculation module 358 can to do a write to any one of the memory 352, the transaction table 354, and the memory management module 356.

Figure 3B:
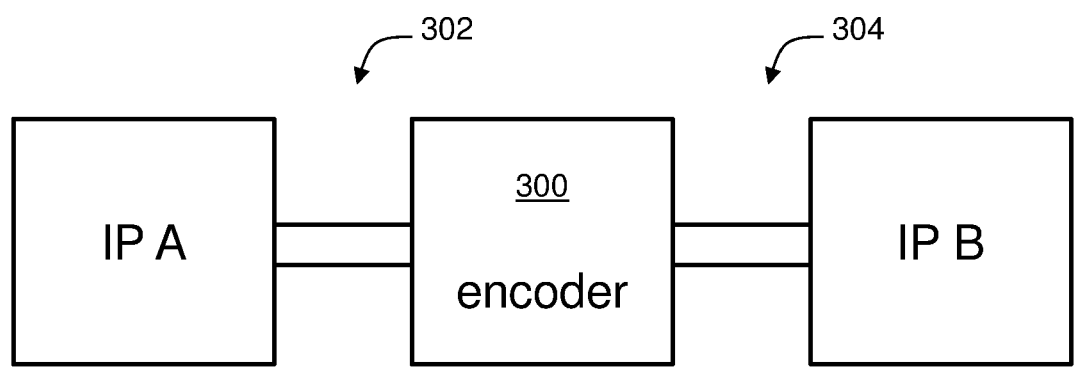
FIG. 3B shows two IP cores coupled through an encoder.

FIG. 3B shows an embodiment of the invention in which IP A and IP B are coupled through an encoder 300. IP A sends, and encoder 300 receives, data and 7-bit ECC through interface 302. The encoder 300 calculates a 4-bit party signal. Furthermore, encoder 300 sends, and IP B receives, data and 4-bit party through interface 304.

Figure 3C:
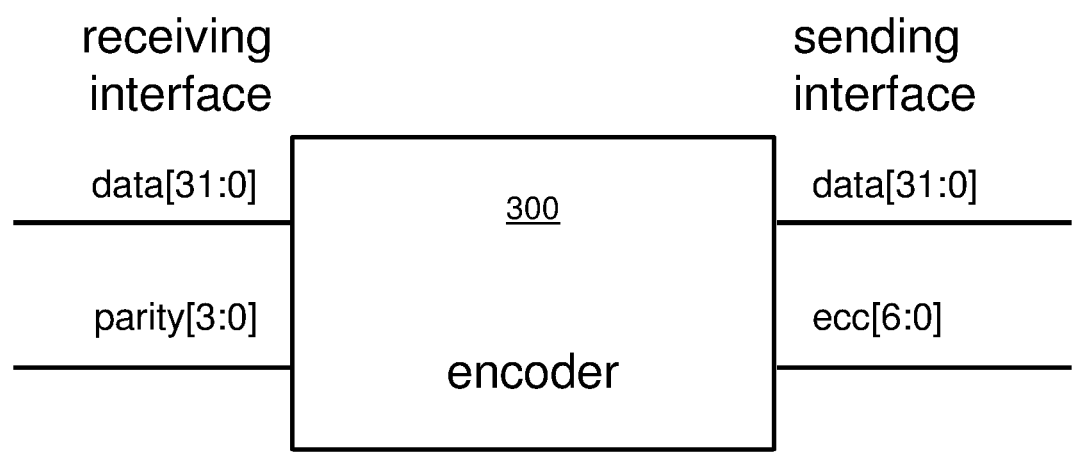
FIG. 3C shows an encoder with a receiving interface and a sending interface.

FIG. 3C shows encoder 300, which includes a receiving interface and a sending interface. The receiving interface includes a 32-bit data signal and a 4-bit parity signal. The sending interface includes a 32-bit data signal and a 7-bit ECC signal. The sending interface sends the same data values as received on the receiving interface. Different embodiments of the invention have different internal design of the encoder 300 that may use different parity encoding functions, may perform an ECC checking function, will have varying amounts of delay, and have varying other attributes of protection scheme encoding.

Figures 4A, 4B:
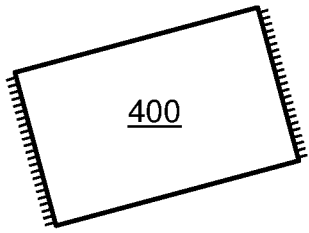
FIG. 4A shows a non-transient computer-readable medium.
FIG. 4B shows source code for a placeholder for an encoder.

FIG. 4A depicts a negative-and (NAND) flash memory chip 400. This is a type of non-transient computer readable medium on which source code is stored according to some embodiments of the invention. Some other embodiments use other types of computer readable media such as hard disk drives, compact disk read-only memory (CD-ROM), and punch cards.

FIG. 4B depicts a source code file 410 that is in accordance with some aspects of the invention. It is a module, written in the SystemVerilog HDL language. It includes inputs of a receiving interface with a 32-bit data signal and a 4-bit parity signal and it includes outputs of a sending interface with a 32-bit data signal and a 7-bit ECC signal. The aspects of the invention as embodied in this is particular embodiment of the invention is a placeholder module. It enables a designer to add code that describes the function of an encoder.

A vendor of third-party interconnect IP provides such a module to chip designers so that they are able to effectively customize the interconnect IP according to their desired error protection scheme. That way the interconnect IP provider need not learn the chip designer's requirements to customize the interconnect IP and the chip designers need not redesign the interconnect IP for their requirements.

Figure 5A:
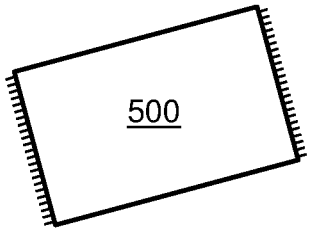
FIG. 5A shows a non-transient computer-readable medium.
Figure 5B:
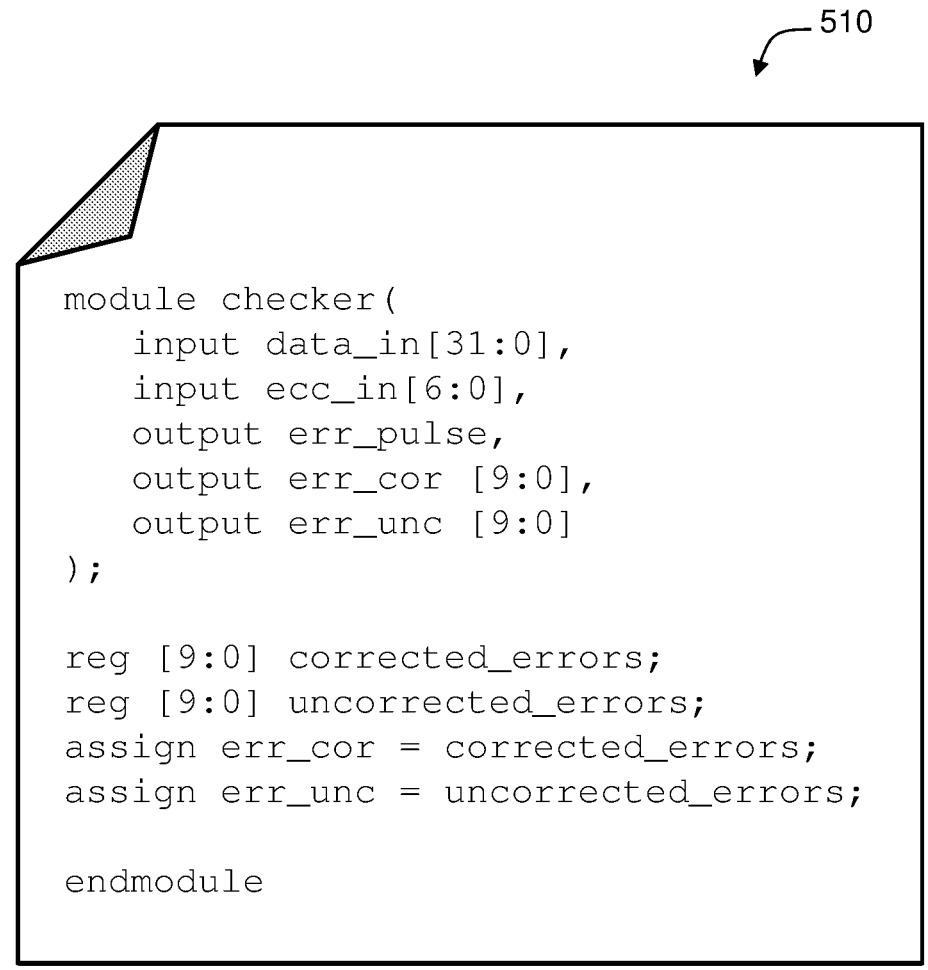
FIG. 5B shows source code for a placeholder for a checker.

FIG. 5A depicts the non-transient computer readable NAND flash memory 500, arranged to store the source code file 510, as shown in FIG. 5B. The source code of file 510 is a SystemVerilog checker placeholder according to an aspect and embodiment of the invention. It includes a receiving interface with a 32-bit data input signal and a 7-bit ECC signal. The module further includes output signal, err_pulse, which produces a pulse when the checker detects an error. Such a pulse is useful to interrupt a CPU so that it can handle such an error condition. The module further includes output 10-bit signals err_cor and err_unc. Those signals are driven by counter registers, corrected_errors and uncorrected_errors. The placeholder code allows a chip designer to count the number of errors detected through the ECC protection scheme and count the number of errors that corrected over time.

Figure 6A:
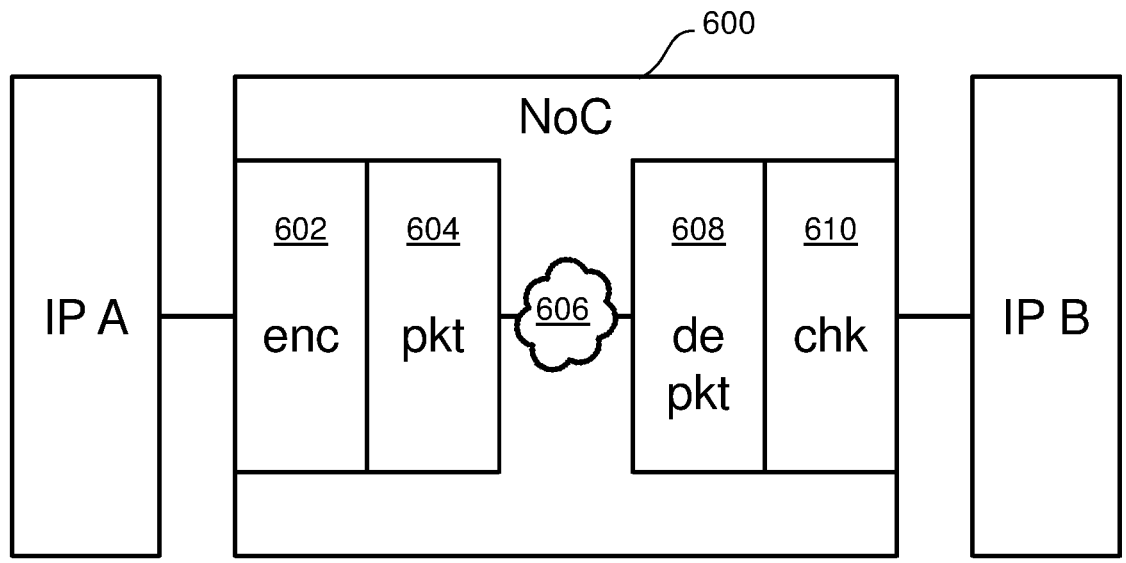
FIG. 6A shows IPs and a NoC within an SoC, the NoC performing encoding, packetizing, transport, depacketizing, and checking.

FIG. 6A shows IPs within a SoC according to various aspects in an embodiment of the invention. IP A is coupled to IP B through a NoC interconnect IP 600. NoC 600 facilitates and performs error resilient packet-based communication. For that, NoC 600 includes various units that operate on information sent from IP A to IP B. In sequence, encoder unit 602 generates redundant information according to a protection scheme as shown in FIG. 4. Packetizing unit 604 encodes data and redundant information in packets that include headers, and for some packets, payloads. Network 606 transports packets between IPs and, in some embodiments, serves to transport packets between many IPs other than IP A and IP B. Depacketizing unit 608 receives packets from network 606 and presents the data and redundant information to checking unit 610. Checking unit 610 checks the data and redundant information for consistency, and indicates errors as shown in FIG. 6A.

Figure 6B:
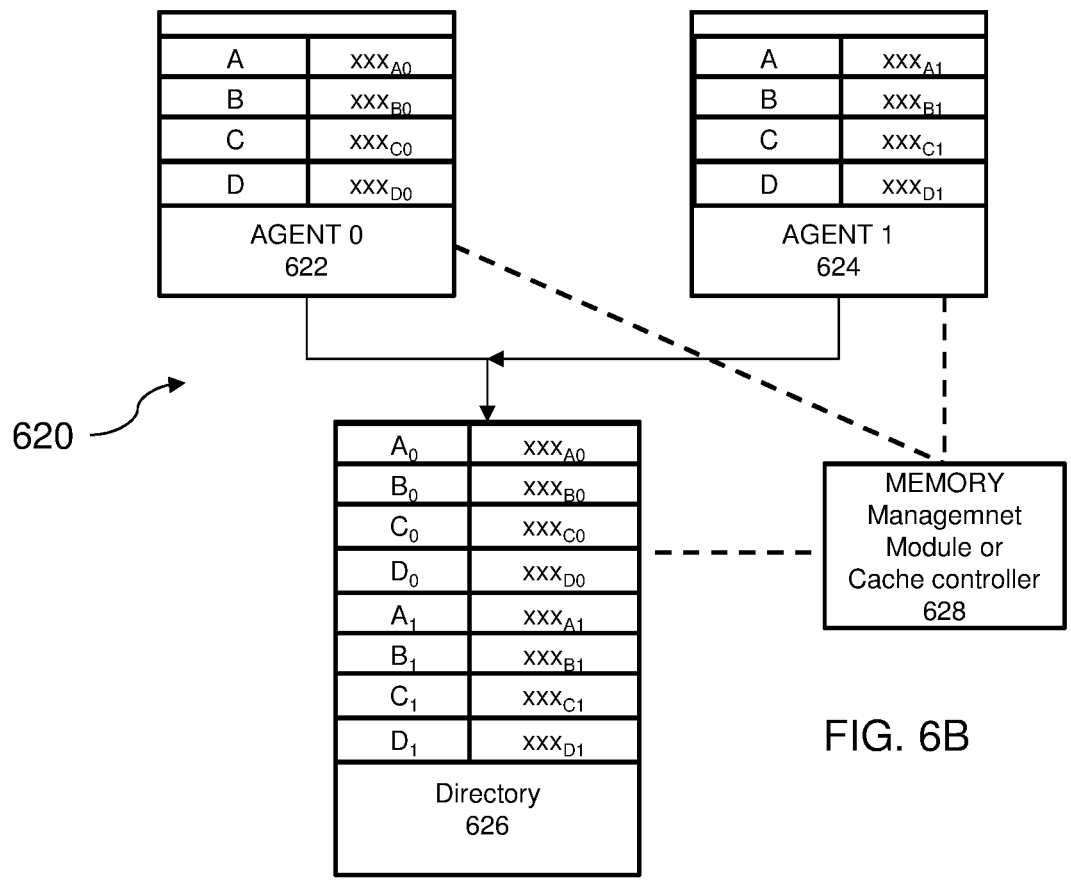
FIG. 6B shows a system having at least two agents in communication with a directory.

Referring now to FIG. 6B, a coherent memory system 620, with coherent memory, is shown in accordance with the various embodiments and aspects of the invention. The system 620 includes an agent 622 (A0), an agent 624 (A1), and a directory 626. The agents 622 and 624 are in communication with the directory 626. In accordance with some embodiments, the system 620 includes a cache controller 628 that is in communication with agent 622, agent 624, and directory 626. In accordance with some embodiments, the function of the cache controller 628 may be distributed throughout the system 620, for example, located at each of the agents 622 and 624. In accordance with some embodiments, the cache controller may be a stand-alone unit with the ability to access information and communicated directly with each agent and the directory, independently. As noted earlier, the various embodiments of the invention allow for a cache controller to be a separate functional unit or functionally part of each agent, which is indicated by the dashed lines of FIG. 6B.

The ways or address lines (tags) in the agents 622 and 624 are maintained in the directory 626 as required by the coherency memory for the system 620, as shown. In the system 620, which is a coherent memory system with caches, whenever the address line and the state (or ways) stored in the tag line of an agent, such as agent 622 and agent 624, is corrupted or no longer known, a cache tag uncorrectable error happens that leads to loss of coherency. The uncorrectable error is detected using an error detecting code. In accordance with the aspects of the invention, when the uncorrectable error is detected, the system 620 uses the directory 626 to recover from the uncorrectable error in corrupted tag or way (address line) that is no longer known. In order to recover from the uncorrectable error, the system 620 generates a protocol transaction request. The protocol transaction request is a query that is sent to the directory 626. The query can be generated at the cache controller or at the agent. The query includes, at least, an address and/or state (a way) for the unknown or corrupted tag stored in the agent. The system 620 causes the query to be sent from or on behalf of the agent, which has the corrupted address (way) of tag, to the directory 626. The directory 626 sends a response back to provide information that allows the system 620 to find the correct address (or way) of the tag-line and correct the error.

In accordance with the various aspects and embodiments of the invention, when a transaction accessing a tag array, which has an address and state (way), encounters an uncorrectable error, the system 620 determines a possible set of addresses and states (or ways). The possible set of addresses represent all of the addresses, which are based on the corrupted address or way (tag) or uncorrectable error, and determined based on the algorithm used for error detection. For example, in accordance with some aspects of some embodiments, if the error detection used an algorithm that is based on PARITY, then only one bit of entry or the corrupted address has gone bad. In accordance with some aspects of some embodiments, if error detection used an algorithm that is based on SECDED, then two one bits of entry or the corrupted address have gone bad.

If an address stored in tag is "n-bits," then for PARITY there are a possible of "n" different addresses (nC1=n addresses with one corrupted bit), wherein any one of which addresses represents the correct address for that way or tag or location. For example, if the corrupted address or uncorrectable error is 100101, which is 6-bits long, then any one of the bits could be in error. As such, the system 620 generates the possible set of address bits, with a Hamming distance of more than two for PARITY, that would contain the correct address, which is the following set of possible addresses:

100100, 100111, 100001, 101101, 110101, and 000101.

Similarly, if an address stored in tag is "n-bits," then for SECDED there are a possible of "n(n−1)/2" different addresses (nC2=n addresses with two corrupted bits), wherein any one of which addresses represents the correct address for that way or tag or location. As such, the system 620 generates the possible set of address bits, with a Hamming distance of more than four for SECDED. If the system 620 detects error on 2 or more ways or address states, at the same time, then there exists a possibility that possible addresses from the 2 ways getting corrupted may be same. As outlined below when the directory 626 receives the request, then the directory 626 may respond with a VALID or positive response. Thus, in accordance with the aspects and embodiments of the invention, hamming distance between 2 corrupted tags should be more than 2 for parity and more than 4 for SECDED.

The directory 626 tracks all the addresses and states associated with each agent in the system 620. When the uncorrectable error is detected, the system 620 generates and sends a special protocol transaction request with one of the possible addresses selected from the set of addresses to the directory 626. The special protocol transaction request queries the directory 626 about the state of address or way in the directory 626 to determine if there is a match between the address sent to the directory 626 and the actual address stored in the directory 626, which is the correct and uncorrupted address or tag. The directory 626 does a comparison and responds with the state of that address, which is based on a comparison of the address sent in special protocol transaction request and the address stored in the directory 626. The response from the directory 626, based on the comparison, is one of: Valid, Invalid, Owned, Shared. The system 620, using the cache controller, will go through the set of possible addresses mentioned above until it finds a match. Once the directory 626 sends a response that indicated a valid state, the correct tag address and state is identified. The system 620 can now replace the tag address and state with the uncorrectable error, error with the error is corrected. This would enable the system 620 to recover from an uncorrectable tag address or state error in one of the caches and coherent system can remain operational by recovering from the uncorrectable error.

Figure 6C:
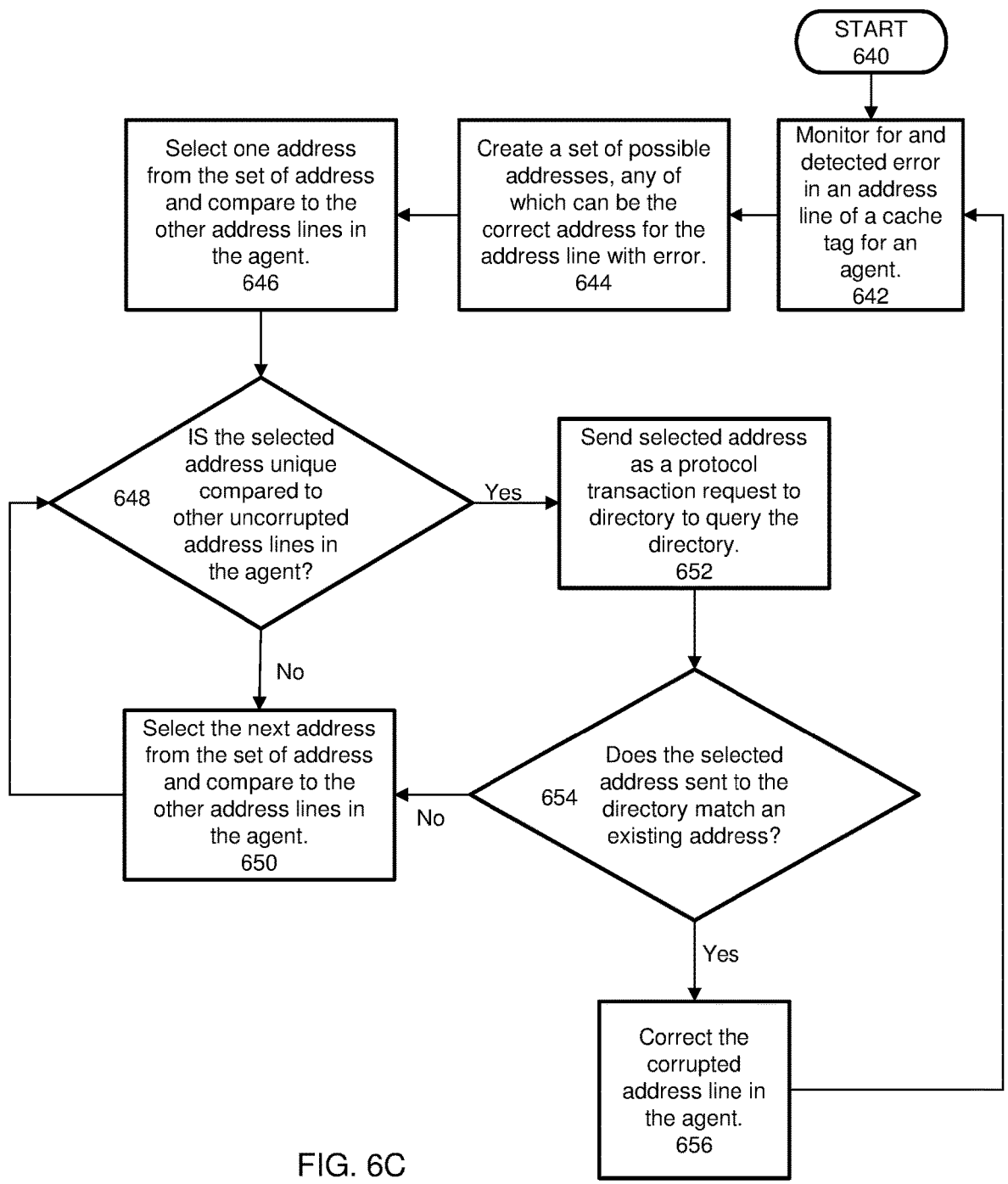
FIG. 6C shows a flow process for correcting an uncorrectable error in an address line of an agent.

Referring to FIG. 6B and FIG. 6C, which shows a method or process used by the system 620 for correcting uncorrectable error is shown in accordance with aspects and embodiments of the invention. The process being at step 640. At step 642 the system monitors for and detects if a cache access results in an error on a way at an agent. Upon detecting an error, the system 620, at step 644 creates a set of possible address, any one of which can be the correct address or way. At step 646, the system 620 selects one address from the set of possible addresses and compares it to other ways or address in the agent.

At step 648, the system 620 determines if the selected address is unique compared to other addresses or ways in the agent. If the address or way, which is selected from the possible set of address, is not unique, then at step 650 the cache controller of the system 620 selects the next or another address from the set of possible addresses to determine if the newly selected address is unique. If the address or way, which is selected from the possible set of address at step 646, is unique, then the process continues to step 652. At step 652, the cache controller of the system 620 sends a protocol transaction request as a query to the directory 626. The address selected, as noted above, is unique and excludes possible address matches with one of the existing non-corrupted ways or addresses already in the agent.

The system 620, at step 654, determines if there is a match between the protocol transaction request with the address or way sent to the directory 626 and the address or way in the directory 626. If, at step 654, there is no match, the directory 626 indicates the failed match between this way or address and responds with an INVALID response to the cache controller and the process returns to step 650 to select the another or next address from the set of possible addresses. If, at step 654, the directory 626 determines there is a match between the protocol transaction request with the way or address, then the directory responds with a VALID response to the cache controller and the process continues to step 656. The step 656 the correct address or way is identified and the way or address line (tag), which had the uncorrectable error, is identified and error is corrected by updating the information in the agent (or cache controller) with the correct address ow way (tag) information.

According the various aspects and embodiments of the invention, using minimal software and hardware implementation at each agent or at the cache controller, the system can query the directory whenever an uncorrectable error of this type occurs. This allows the system to reduce tag size significantly. The ECC overhead is around 20% of the tag area. Using the various embodiment of the invention, which allows a protocol transaction request to be send from the cache controller or the agent to the directory, the system is not required to protect tag memories with ECC; parity is enough to detect and correct the errors. This results in a reduction in overall tag area, which can be about 20%. The effect is a lower SRAM area, which results in lower power consumption and more efficient system operation in the presence of uncorrectable errors. Also, the ability to recover from an uncorrectable error, using the protocol transaction query, is a protocol level technique that directly improves system resiliency.

Figure 7:
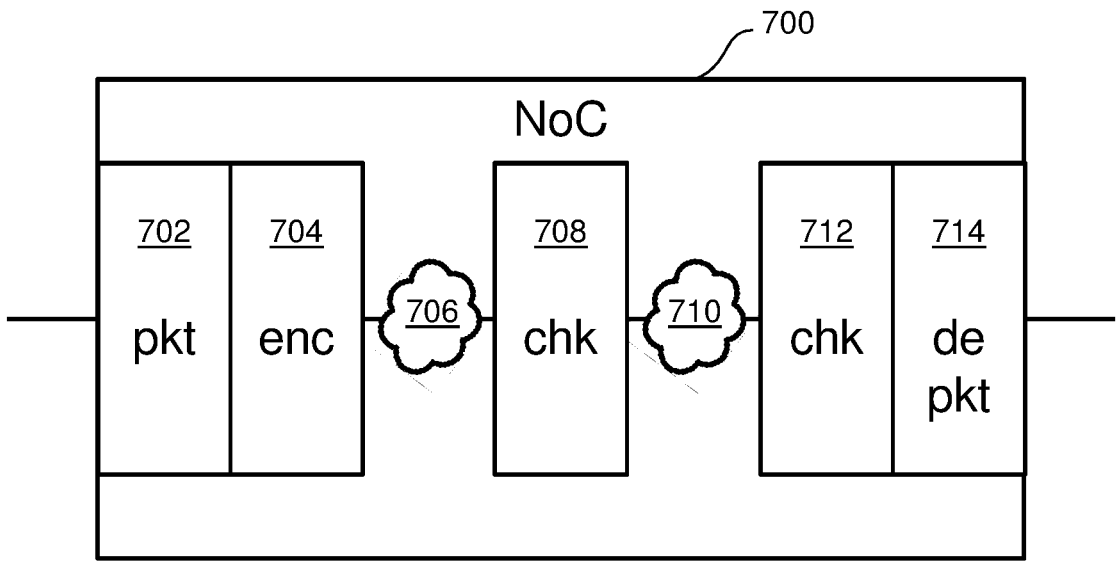
FIG. 7 shows a NoC that performs packetizing, encoding, transport, checking, further transport, checking, and depacketizing.

Whereas NoC 600 performs encoding before packetizing and checking after depacketizing, FIG. 7 shows a NoC 700 in which packetizing unit 702 packetizes data for transport. Encoding unit 704 calculates redundant information according to a protection scheme. Network 706 transports protected packets to checking unit 708, which checks consistency and reports errors. Network 710 transports unmodified packets to checker 712, which checks consistency and reports errors. In accordance with the aspects of the invention, different embodiments have various numbers of checkers through which packets pass within a NoC. According to the embodiment of FIG. 7, checked packets proceed through depacketizing unit 714.

Figure 8:
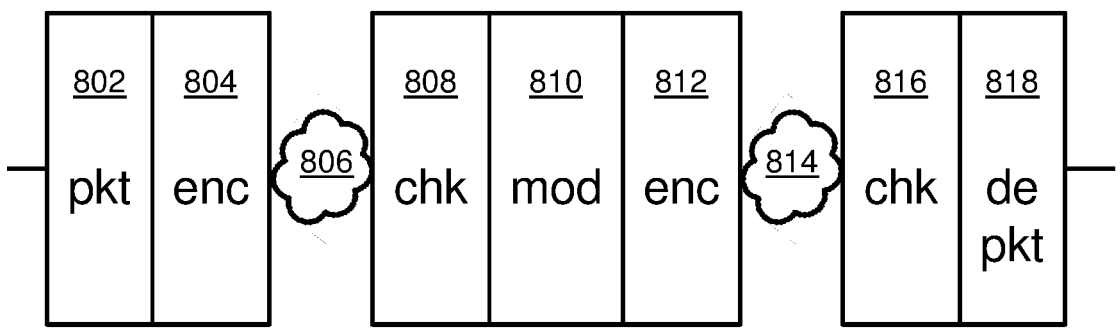
FIG. 8 shows units of a NoC that perform packetizing, encoding, transport, checking, modification, encoding, further transport, checking, and depacketizing.

FIG. 8 shows the units of a NoC according to aspects of invention as shown in another embodiment. Packetizing unit 802 packetizes data. Encoder unit 804 calculates redundant information and encodes protected packets. Network 806 transports packets to checker unit 808, which check consistency and reports errors. Modification unit 810 modifies the packet format. In some embodiments, modification involves changing the payload data, such as by changing the serialization and in some embodiments modification involves changing the packet header, which for the purposes of protection schemes is data from which redundant information is calculated. Encoder unit 812 calculates redundant information for the modified packet, according to a protection scheme. In some embodiments, the protection scheme used by encoding unit 804 and the protection scheme used by encoder unit 812 are the same scheme, but in some embodiments, they are different schemes. Network 814 transports packets to checking unit 816, which checks consistency and reports errors. Depacketizing unit 818 depacketizes the packets and presents the data to a connected IP.

In some embodiments, depacketizing unit 818 is a widening serialization adapter. It concatenates a multiplicity of incoming data words into a wider outgoing data word. For such, encoder unit 812 concatenates the bits of the incoming parity of multiple data words into a parity signal for the wider outgoing data word.

In some embodiments, depacketizing unit 818 is a narrowing serialization adapter. It splits incoming data words into a multiplicity of narrower outgoing data words. For such, encoder unit 812 checks a certain number of ECC bits for the wide incoming data words and encoder unit 812 encodes a smaller number of ECC bits for each narrower outgoing data word.

In some embodiments, depacketizing unit 818 is a firewall unit. Unit 818 checks software-defined security bits in packet headers, and in some cases unit 818 changes the state of a packet header bit. For such, encoder unit 812 encodes outgoing ECC bit values that may differ from the incoming ECC bit values, though using the same ECC protection scheme.

Figure 9:
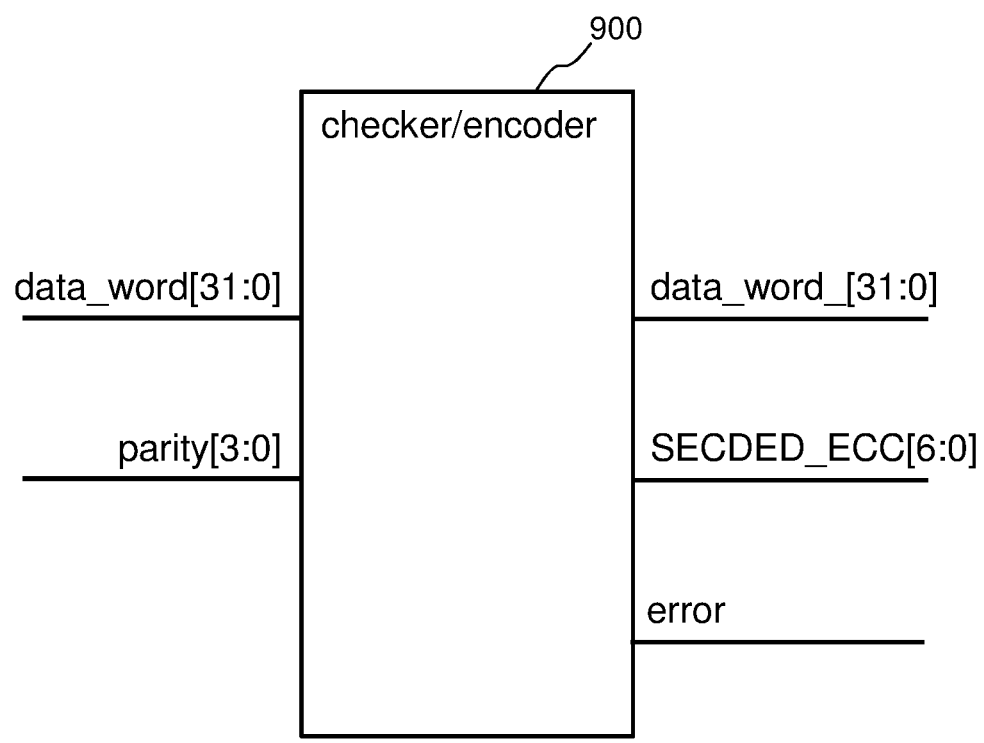
FIG. 9 shows a checker/encoder that receives per-byte parity and sends per-word SECDED ECC.

FIG. 9 shows a checker/encoder 900 according to an embodiment of the invention. It receives and sends 32-bit data words. Its receive interface uses a per-byte parity scheme, with one parity bit per byte of each 32-bit (4-byte) data word. The sending interface of checker/encoder 900 uses a 7-bit SECDED ECC protection scheme. SECDED ECC is calculated per 32-bit data word. Checker/encoder 900 outputs an error signal that pulses for detected errors.

Figure 10:
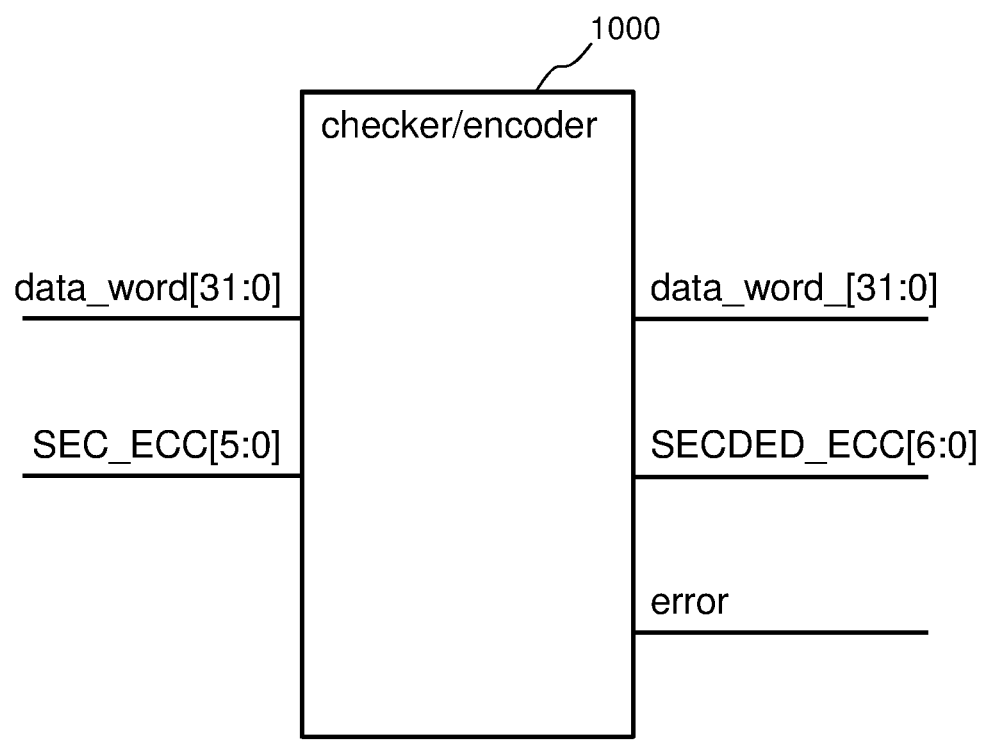
FIG. 10 shows a checker/encoder that receives per-word SEC ECC and sends per-word SECDED ECC.

FIG. 10 shows a checker/encoder 1000 according to an embodiment of the invention. It receives and sends 32-bit data words. Its receive interface uses a per-word SEC ECC scheme, with 6 bits per 32-bit data word. The sending interface of checker/encoder 1000 uses a 7-bit SECDED ECC protection scheme. SECDED ECC is calculated per 32-bit data word. Checker/encoder 1000 outputs an error signal that pulses for detected errors.

Figure 11:
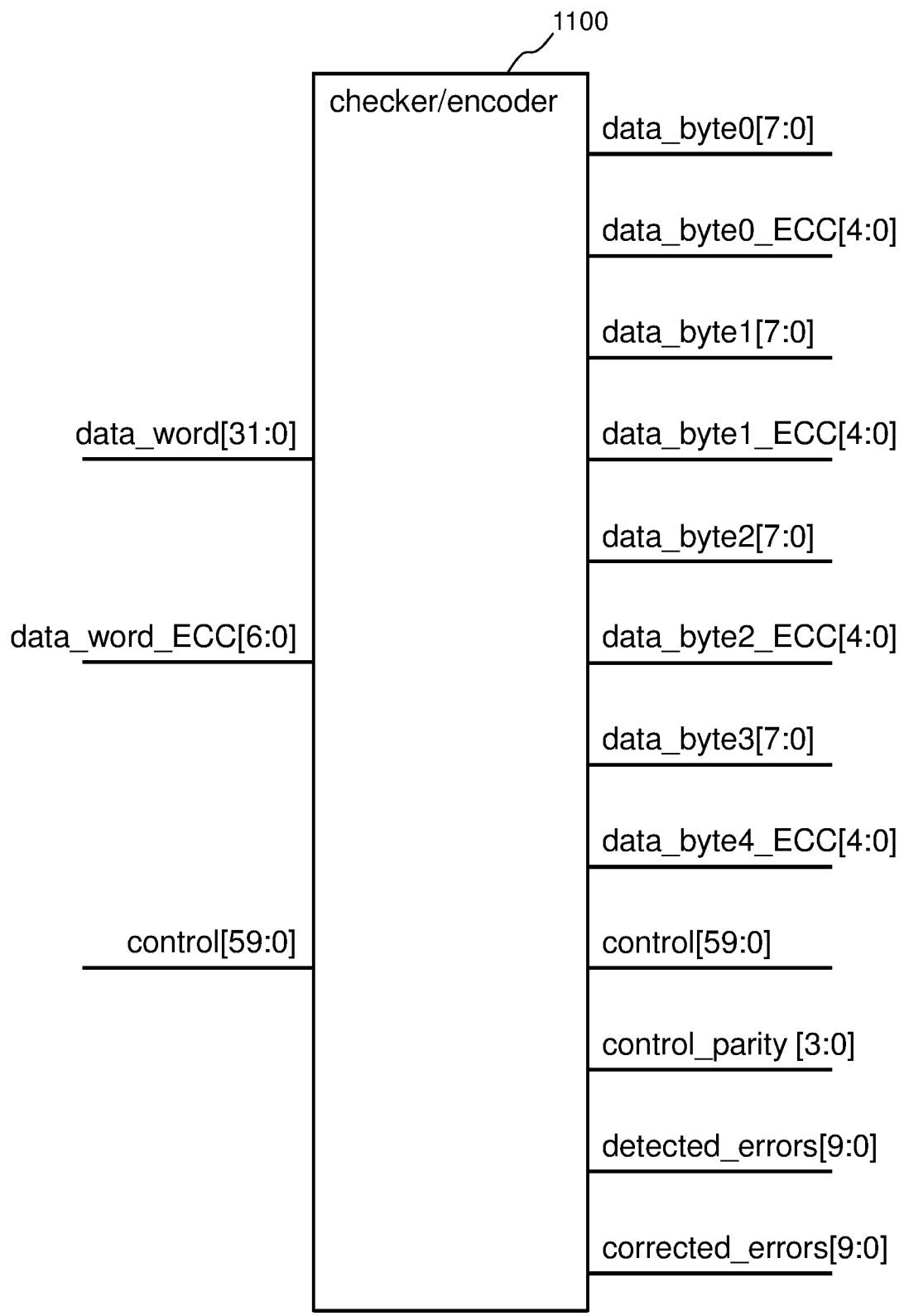
FIG. 11 shows a checker/encoder that receives per-word SECDED ECC and control information, and sends per-byte SECDED ECC, control word parity, and counts of detected and corrected errors.

FIG. 11 shows a checker/encoder 1100 according to an embodiment of the invention. It receives 32-bit data words and sends four data bytes. The receive interface of checker/encoder 1100 uses a 7-bit per-word ECC scheme for the data, and includes a 60-bit unprotected control signal. The sending interface of checker/encoder 1100 uses a 5-bit SECDED ECC protection scheme per data byte. The sending interface also sends a 4-bit parity signal per control word. The checker/encoder 1100 also outputs a 10-bit count signal for detected errors and another 10-bit count signal for corrected errors.

Figure 12:
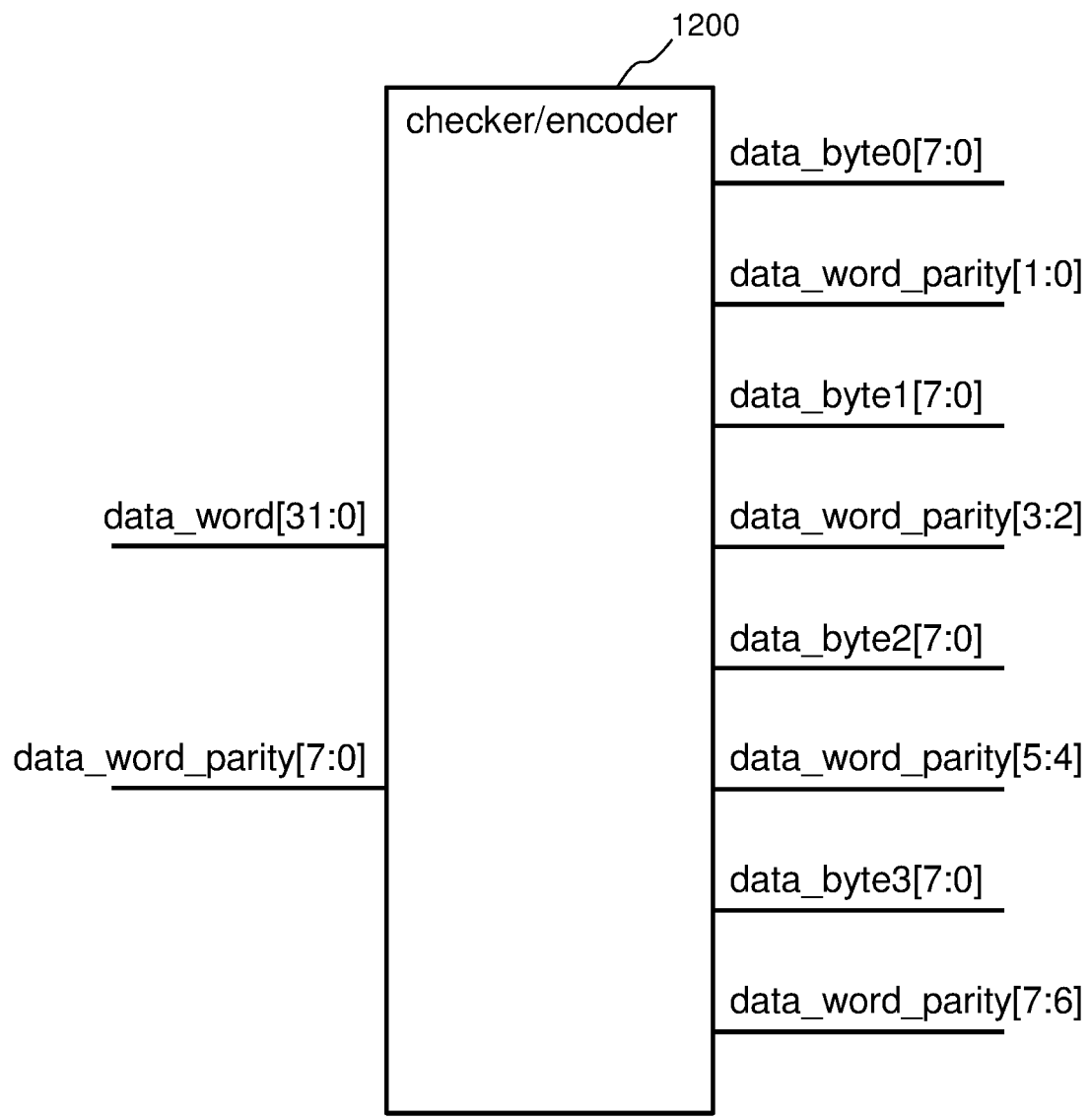
FIG. 12 shows an encoder that receives per-nibble parity and encapsulates it as per-byte information.

FIG. 12 shows an encoder 1200 according to an embodiment of the invention. It receives 32-bit data words and sends 4 separate data bytes. Its receive interface uses a per-word party scheme, with 8 bits per 32-bit data word. The sending interface of encoder 1200 uses a 2-bit parity per byte protection scheme. The encoding of parity bits on the sending interface is an interleaved mapping of the bits of the incoming data word parity. Encoder 1200 does not check for errors.

Some embodiments of physical machines described and claimed herein are programmable in numerous variables, combinations of which provide essentially an infinite variety of operating behaviors. Some embodiments of hardware description language representations described and claimed herein are configured by software tools that provide numerous parameters, combinations of which provide for essentially an infinite variety of physical machine embodiments of the invention described and claimed. Methods of using such software tools to configure hardware description language representations embody the invention described and claimed. Physical machines, such as semiconductor chips; hardware description language representations of the logical or functional behavior of machines according to the invention described and claimed; and one or more non-transitory computer readable media arranged to store such hardware description language representations all can embody machines described and claimed herein.

The behavior of either or a combination of humans and machines; instructions that, if executed by one or more computers, would cause the one or more computers to perform methods according to the invention described and claimed; and one or more non-transitory computer readable media arranged to store such instructions embody methods described and claimed herein. Each of more than one non-transitory computer readable medium needed to practice the invention described and claimed herein alone embodies the invention.

Additionally, it is intended that such equivalents include both currently known equivalents and equivalents developed in the future, i.e., any elements developed that perform the same function, regardless of structure. The scope of the invention, therefore, is not intended to be limited to the exemplary embodiments shown and described herein.

In accordance with the teachings of the invention, a computer and a computing device are articles of manufacture. Other examples of an article of manufacture include: an electronic component residing on a mother board, a server, a mainframe computer, or other special purpose computer each having one or more processors (e.g., a Central Processing Unit, a Graphical Processing Unit, or a microprocessor) that is configured to execute a computer readable program code (e.g., an algorithm, hardware, firmware, and/or software) to receive data, transmit data, store data, or perform methods.

The article of manufacture (e.g., computer or computing device) includes a non-transitory computer readable medium or storage that may include a series of instructions, such as computer readable program steps or code encoded therein. In certain aspects of the invention, the non-transitory computer readable medium includes one or more data repositories. Thus, in certain embodiments that are in accordance with any aspect of the invention, computer readable program code (or code) is encoded in a non-transitory computer readable medium of the computing device. The processor or a module, in turn, executes the computer readable program code to create or amend an existing computer-aided design using a tool. The term "module" as used herein may refer to one or more circuits, components, registers, processors, software subroutines, or any combination thereof. In other aspects of the embodiments, the creation or amendment of the computer-aided design is implemented as a web-based software application in which portions of the data related to the computer-aided design or the tool or the computer readable program code are received or transmitted to a computing device of a host.

An article of manufacture or system, in accordance with various aspects of the invention, is implemented in a variety of ways: with one or more distinct processors or microprocessors, volatile and/or non-volatile memory and peripherals or peripheral controllers; with an integrated microcontroller, which has a processor, local volatile and non-volatile memory, peripherals and input/output pins; discrete logic which implements a fixed version of the article of manufacture or system; and programmable logic which implements a version of the article of manufacture or system which can be reprogrammed either through a local or remote interface. Such logic could implement a control system either in logic or via a set of commands executed by a processor.

Accordingly, the preceding merely illustrates the various aspects and principles as incorporated in various embodiments of the invention. It will be appreciated that those of ordinary skill in the art will be able to devise various arrangements, which, although not explicitly described or shown herein, embody the principles of the invention and are included within its spirit and scope. Furthermore, all examples and conditional language recited herein are principally intended to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

The scope of the invention, therefore, is not intended to be limited to the various aspects and embodiments discussed and described herein. Rather, the scope and spirit of invention is embodied by the appended claims.

What is claimed is:

1. A method of reducing tag area in memory, the method comprising:
   using error detecting code to detect an uncorrectable error in a corrupted way of an agent;
   generating a protocol transaction request in response to the corrupted way, wherein the protocol transaction request includes a possible way corrections selected from a plurality of possible way corrections for the corrupted way based on the error detection code to reduce the tag area in memory;
   sending, to a directory, the protocol transaction request including the selected possible way correction;
   receiving, from the directory, a response that includes an indication of a match between the selected possible way correction included with the protocol transaction request and a correct way, wherein the correct way is tracked in the directory; and
   rewriting the corrupted way in the agent with the correct way identified by the response from the directory thereby replacing and correcting the corrupted way.

2. A method for handling uncorrectable errors in an address line of an agent in a system including coherent memory, the method comprising:
   detecting, using error detecting code, an uncorrectable error resulting from a corrupted address line of the agent;
   generating a set of possible corrected addresses that are used to query a directory, wherein the set of possible corrected addresses include a correct address and the correct address is also stored and tracked in the directory and the set of possible corrected addresses are, each, currently unique relative to other addresses in the agent;
   selecting a first address from the set of possible corrected addresses;
   sending, to the directory, a first possible corrected address in a protocol transaction request;
   determining if the first possible corrected address matches the correct address tracked by the directory;
   receiving, from the directory, a response to indicate if there is a match between the first possible corrected address included in the protocol transaction request and the correct address tracked by the directory; and
   when the directory's response indicates that there is a match, rewriting the corrupted address of the agent with the correct address to replace the corrupted address line to correct the uncorrectable error and eliminating a need to restart the system.

3. The method of claim 2, further comprising selecting a second possible corrected address from the set of possible corrected addresses when the directory's response indicates that the first possible corrected address in the protocol transaction request is invalid relative to the correct address tracked in the directory.

4. A system with coherent memory, the system comprising:
   a memory, including code;
   at least one agent in communication with the memory, wherein the agent includes coherent cache lines;
   at least one directory in communication with the agent and memory, wherein the directory includes coherent cache lines corresponding to each coherent cache line in the agent; and
   a processor in communication with the memory, such that when the processor executes the code stored in the memory, the system is caused to:
      identify an uncorrectable error caused by a corrupted address line of the agent;
      determine a set of possible corrected address lines used to query the directory, wherein the set of possible corrected address lines include a correct address line that is also tracked by the directory and the set of possible corrected address lines are, each, unique relative to other address lines in the agent;
      select a first possible corrected address line from the set of possible corrected address lines;
      send, to the directory, the first possible corrected address line as part of a protocol transaction request;
      determine if the first possible corrected address line matches the correct address line tracked by the directory;
      receive, from the directory, a response; and
      rewrite, at the agent, the corrupted address line with the correct address when the directory's response indicates that there is a match to the first possible corrected address line in the protocol transaction request.

5. The system of claim 4 further comprising a cache controller at least in communication with the directory, wherein the cache controller generates the protocol transaction request.

6. The system of claim 4 wherein the agent generates the protocol transaction request.

\* \* \* \* \*